(12) United States Patent
Hofrichter et al.

(10) Patent No.: US 11,276,619 B2
(45) Date of Patent: Mar. 15, 2022

(54) RADIATION-HARDENED PACKAGE FOR AN ELECTRONIC DEVICE

(71) Applicant: ams International AG, Rapperswil (CH)

(72) Inventors: Jens Hofrichter, Rapperswil (CH); Guy Meynants, Rapperswil (CH); Josef Pertl, Rapperswil (CH); Thomas Troxler, Rapperswil (CH)

(73) Assignee: AMS INTERNATIONAL AG, Rapperswil (CH)

( * ) Notice: Subject to any disclaimer, the term of this patent is extended or adjusted under 35 U.S.C. 154(b) by 43 days.

(21) Appl. No.: 16/624,484

(22) PCT Filed: Jun. 13, 2018

(86) PCT No.: PCT/EP2018/065685
§ 371 (c)(1),
(2) Date: Dec. 19, 2019

(87) PCT Pub. No.: WO2018/234120
PCT Pub. Date: Dec. 27, 2018

(65) Prior Publication Data
US 2020/0176343 A1 Jun. 4, 2020

(30) Foreign Application Priority Data
Jun. 23, 2017 (EP) .................... 17177707

(51) Int. Cl.
*H01L 23/31* (2006.01)
*H01L 23/18* (2006.01)
(Continued)

(52) U.S. Cl.
CPC .......... *H01L 23/3121* (2013.01); *H01L 23/18* (2013.01); *H01L 23/295* (2013.01);
(Continued)

(58) Field of Classification Search
CPC ..... H01L 23/3121; H01L 24/04; H01L 24/48; H01L 25/167; H01L 23/18; H01L 23/552;
(Continued)

(56) References Cited

U.S. PATENT DOCUMENTS 5,898,198 A 4/1999 Herbert et al.
7,729,393 B2 6/2010 Young et al.
(Continued)

FOREIGN PATENT DOCUMENTS

WO WO 2016/097850 6/2016

OTHER PUBLICATIONS

European Examination Report in corresponding European Application No. 17177707.1 dated Feb. 18, 2021, 7 pages.
(Continued)

*Primary Examiner* — Mouloucoulaye Inoussa
(74) *Attorney, Agent, or Firm* — MH2 Technology Law Group LLP

(57) ABSTRACT

The package comprises a carrier, an electronic device arranged on the carrier, a shield arranged on the electronic device on a side facing away from the carrier, and an absorber film comprising nanomaterial applied on or above the shield.

16 Claims, 4 Drawing Sheets

(51) Int. Cl.
| | |
|---|---|
| H01L 23/29 | (2006.01) |
| H01L 23/552 | (2006.01) |
| H01L 23/00 | (2006.01) |
| H01L 25/16 | (2006.01) |
| B82Y 30/00 | (2011.01) |

(52) U.S. Cl.
CPC ............ *H01L 23/552* (2013.01); *H01L 24/04* (2013.01); *H01L 24/16* (2013.01); *H01L 24/29* (2013.01); *H01L 24/48* (2013.01); *H01L 25/167* (2013.01); *B82Y 30/00* (2013.01); *H01L 2224/04042* (2013.01); *H01L 2224/16227* (2013.01); *H01L 2224/29316* (2013.01); *H01L 2224/29318* (2013.01); *H01L 2224/29393* (2013.01); *H01L 2224/48091* (2013.01); *H01L 2224/48227* (2013.01)

(58) Field of Classification Search
CPC ....... H01L 24/16; H01L 24/29; H01L 23/295; H01L 31/035218; H01L 31/0324; H01L 27/1461; H01L 27/1463; H01L 27/14627; H01L 27/14621; H01L 27/307; H01L 27/14623; H01L 27/1464; H01L 27/14609; H01L 27/14632; H01L 27/14643; H04N 9/045; H04N 9/735; H04N 5/3696; H04N 5/361; H04N 5/363; G01N 27/4148; G01N 27/414; B01L 3/502
USPC .......... 257/21, 230, 443, 432, 253, E21.158, 257/E31.033, E31.126, E21.214, E31.127; 438/63, 72, 65, 49
See application file for complete search history.

(56) References Cited

U.S. PATENT DOCUMENTS

| | | | |
|---|---|---|---|
| 8,154,007 | B2 | 4/2012 | Shieh et al. |
| 8,735,894 | B2 | 5/2014 | Cai et al. |
| 8,742,447 | B2 | 6/2014 | Kim et al. |
| 8,829,336 | B2 | 9/2014 | Raffaelle et al. |
| 9,448,356 | B2 | 9/2016 | Cho et al. |
| 9,589,908 | B1 * | 3/2017 | Parmon ............... H01L 21/4853 |
| 2005/0184405 | A1 | 8/2005 | Bai et al. |
| 2008/0121946 | A1 * | 5/2008 | Youn .................... G01N 27/122 257/253 |
| 2008/0142932 | A1 | 6/2008 | Beer et al. |
| 2010/0187501 | A1 * | 7/2010 | Toda ................. H01L 27/14601 257/21 |
| 2010/0244286 | A1 | 9/2010 | Lagsa |
| 2011/0147902 | A1 | 6/2011 | Van Lieshout |
| 2011/0175235 | A1 | 7/2011 | Horiuchi et al. |
| 2011/0254115 | A1 * | 10/2011 | Shih .................. H01L 27/14685 257/432 |
| 2012/0250351 | A1 | 10/2012 | Shin et al. |
| 2013/0016499 | A1 | 1/2013 | Yee et al. |
| 2013/0075591 | A1 * | 3/2013 | Otake ............... H01L 27/14623 250/208.1 |
| 2014/0035083 | A1 * | 2/2014 | Wan .................. H01L 27/14685 257/432 |
| 2014/0038322 | A1 | 2/2014 | Roozeboom et al. |
| 2014/0231879 | A1 * | 8/2014 | Meynants ......... H01L 27/14887 257/230 |
| 2014/0231973 | A1 | 8/2014 | Huang et al. |
| 2015/0076670 | A1 | 3/2015 | Pan et al. |
| 2015/0091155 | A1 | 4/2015 | Guo et al. |
| 2015/0130009 | A1 * | 5/2015 | Eikyu ................. H01L 27/1463 257/440 |
| 2015/0253487 | A1 * | 9/2015 | Nichol ................. G02B 6/0036 362/610 |
| 2016/0037098 | A1 * | 2/2016 | Lee ....................... H01L 27/307 257/40 |
| 2016/0178570 | A1 * | 6/2016 | Fife .................... G01N 27/4148 257/253 |
| 2016/0233196 | A1 | 8/2016 | Kim et al. |
| 2017/0047312 | A1 * | 2/2017 | Budd .................... H01L 25/117 |
| 2017/0052318 | A1 * | 2/2017 | Hofrichter ............. G02B 6/136 |
| 2017/0132172 | A1 * | 5/2017 | Romem ................ G06F 16/30 |

OTHER PUBLICATIONS

European Patent Office, International Search report for PCT/EP2018/065685 dated Sep. 27, 2018.
Wei, H. et al.: "The Core/Shell Structure of CdSe/ZnS Quantum Dots Characterized by XRay Absorption Fine Spectroscopy" Journal of Nanomaterials, 764712 (2015).
Yakunin, S. et al.: "Detection of X-ray photons by solution-processed lead halide perovskites" Nature Photonics 9, 444-449 (2015).
Ankah, G.N., et al., "PbS quantum dot based hybrid-organic photodetectors for X-ray sensing", *Organic Electronics* 33:201-206 (2016).

* cited by examiner

RADIATION-HARDENED PACKAGE FOR AN ELECTRONIC DEVICE

BACKGROUND OF THE INVENTION

The present invention relates to the field of electronic devices, in particular imaging devices for the detection of high-energy radiation such as X-rays or gamma rays. More specifically, it relates to the fields of computed tomography imaging systems, X-ray flat panel detectors, fluoroscopy, mammography, angiography, positron emission tomography, gamma cameras and other variants of medical imaging devices involving electromagnetic radiation of very short wavelength and ionizing radiation. It also relates to space applications (e. g. satellites), failure analysis or security applications.

Various methods are used to protect sensitive electrical components from X-ray radiation. Shields of a metal with large atomic number, such as tungsten or lead, may be employed for this purpose. The use of such materials are avoided if they are poisonous or too expensive.

US 2015/0076670 A1 discloses a chip mounted on a substrate, and a cover of the chip is formed by an encapsulant. Carbon nanotube and carbon nanocapsule are disclosed for an electromagnetic shielding filter of the encapsulant.

US 2010/0244286 A1 discloses nanocomposites for the purpose of encapsulating optoelectronic devices. A chip is mounted on a PCB header and covered with an encapsulant. A method for encapsulating the optoelectronic device with a nanocomposite includes casting, molding or glob top.

US 2008/0142932 A1 discloses a semiconductor device with a semiconductor chip embedded in a plastic housing composition comprising filler particles, which can especially be carbon nanotubes.

US 2005/0184405 A1 discloses a semiconductor package including a chip carrier, a chip and an encapsulation body, which comprises an electromagnetic absorbing layer on its surface. The absorbing layer is filled with porous metal particles having a plurality of nano-scale pores.

US 2011/0147902 A1 discloses a chip bonded to a substrate by a bonding adhesive, which comprises light absorbing and/or light reflecting particles, in particular nanoparticles, and can fill cavities between the chip and the substrate.

US 2014/0038322 A1 discloses an arrangement of a die with a plurality of light emitting devices, a printed circuit board, and a die comprising an array of photodetectors.

SUMMARY OF THE INVENTION

In the following description and in the claims, the term "nanomaterial" is meant to include any material comprising nanoparticles. The nanomaterial can especially comprise nanodots, nanorods, nanowires, quantum dots, quantum rods or any combination thereof.

In the following description and in the claims, the term "carrier" is meant to include a printed circuit board (PCB), a laminate, a flex circuit, a substrate or an interposer.

The absorption spectrum of quantum dots or other nanoparticles can be tuned to absorb radiation of defined wavelengths, like X-ray radiation, for instance, by appropriately selecting their material, material composition, size and shape. Furthermore, nanoparticles can easily be mixed with polymers, glues and other organic substances that are used to form housings of packages, like glob tops or injection-molded covers. These properties of nanoparticles may be employed in a radiation-hardened package.

In one aspect of the invention the package for an electronic device comprises a carrier, an electronic device arranged on the carrier, a shield arranged on the electronic device on a side facing away from the carrier, and an absorber film comprising nanomaterial applied on or above the shield. In particular, the shield may be formed from aluminum, copper, tungsten or a combination thereof.

In an embodiment of the package, the shield and the absorber film are only arranged on a partial area of an upper surface of the electronic device facing away from the carrier. In particular, the shield and the absorber film may only be arranged above an integrated circuit of the electronic device or especially above a transistor forming a component of an integrated circuit.

In a further aspect of the invention the package for an electronic device comprises a carrier, an electronic device arranged on the carrier, and a further electronic device arranged on the carrier on a side opposite the electronic device. The electronic device is provided with a cover comprising nanomaterial, with an absorber film comprising nanomaterial, or with an adhesive layer comprising nanomaterial, and the further electronic device is also provided with a cover comprising nanomaterial, with an absorber film comprising nanomaterial, or with an adhesive layer comprising nanomaterial.

In a further embodiment at least one of the electronic device and the further electronic device is provided with a cover, and the cover comprises nanomaterial or is provided with an absorber film comprising nanomaterial. The cover may especially be a glob top or part of a glob top. The cover may instead be injection-molded. The cover may also comprise plastic or ceramic.

In a further embodiment at least one of the electronic device and the further electronic device is provided with an adhesive layer between the carrier and the electronic device or between the carrier and the further electronic device, respectively, and the adhesive layer comprises nanomaterial.

A further embodiment comprises an integrated circuit in the electronic device and a photodiode in the further electronic device, the integrated circuit being configured as a read-out circuit for the photodiode.

A further embodiment comprises an interconnection in the carrier, the interconnection electrically connecting the electronic device and the further electronic device.

The nanomaterial may comprise PbS, PbSe, ZnS, ZnS, CdSe, CdTe, copper sulfide, copper oxide, organic perovskites or inorganic perovskites, or any combination thereof. The nanomaterial may include nanodots, nanorods, nanowires, or any combination thereof. The nanorods, nanowires and nanodots may be formed to have at least one dimension that is smaller than 1000 nm, smaller than 100 nm, or even smaller than 10 nm.

BRIEF DESCRIPTION OF THE DRAWINGS

The following is a detailed description of examples of the radiation-hardened package in conjunction with the appended figures.

DETAILED DESCRIPTION

Figure 1:
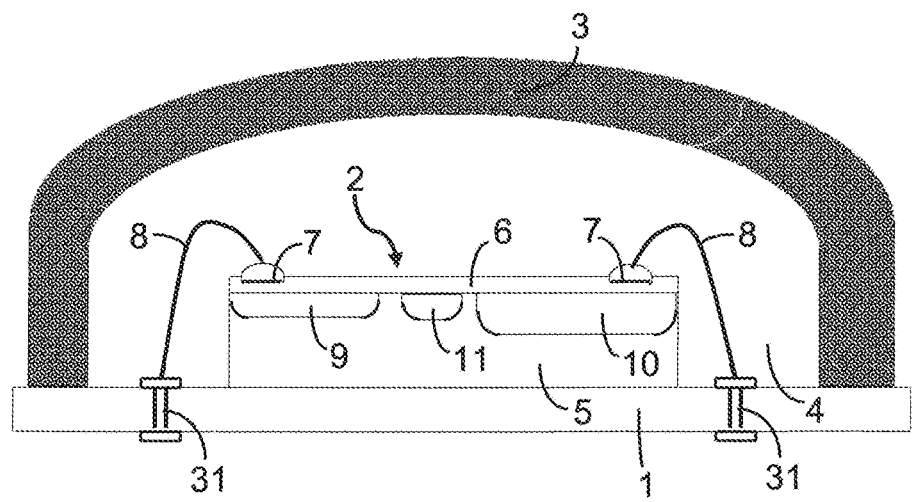
FIG. 1 is a cross section of a radiation-hardened package with a glob top comprising nanomaterial.

FIG. 1 is a cross section of a radiation-hardened package with a glob top comprising a nanomaterial. The electronic device 2 is mounted on a carrier 1, which may be a printed circuit board (PCB), a laminate, a flex circuit, a substrate or an interposer, for instance. A cover 3 comprising nanomaterial is arranged on or above the carrier 1. The electronic device 2 is located in a cavity 4 formed by the cover 3.

The cover 3 may comprise a plastic or flexible basic material, in particular a material that is suitable for a glob top, such as a polymer, for instance. In this case, the cavity 4 is optionally filled with a further material. If the cover 3 is formed from a sufficiently rigid material, the volume of the cavity 4 surrounding the electronic device 2 can be filled with a gas or vacuum.

The package according to FIG. 1 may be produced by embedding the electronic device 2 in a glob top and applying the cover 3 on the glob top. Thus the cavity 4 is filled with the material of the glob top. The basic material of the cover 3 may be a material that is also suitable for a glob top like a polymer, for instance.

The cover 3 may especially contain nanoparticles for X-ray absorption, in particular scintillating nanoparticles, which absorb X-ray radiation and re-emit visible light. The electronic device 2 may be encapsulated in a conventional black, non-transparent glob top filling the cavity 4, and the cover 3 may be provided for enhanced X-ray absorption.

The electronic device 2 may comprise a substrate 5 of semiconductor material with a BEOL (back end of line) layer 6 including at least one wiring. Solder balls 7 can be provided for electric connections by bonding wires 8, for instance. The bonding wires 8 may be connected to interconnections 31 arranged in the carrier 1 for external electric connection, for instance.

The electronic device 2 may comprise various integrated components, like a photodetector 9, an integrated circuit 10 and a guard ring 11, as shown in FIG. 1 by way of example. The integrated components may particularly be provided for a computed tomography (CT) detector, for instance.

Figure 2:
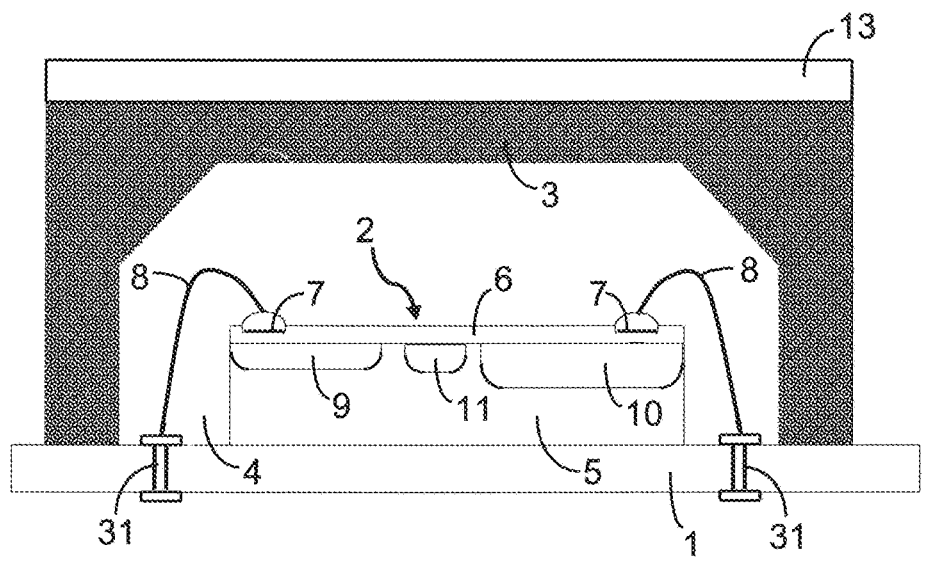
FIG. 2 is a cross section of a radiation-hardened package with an injection-molded cover comprising nanomaterial.

FIG. 2 is a cross section of a radiation-hardened package with an injection-molded cover comprising nanomaterial. Elements of the package according to FIG. 2 that correspond to elements of the package according to FIG. 1 are designated with the same reference numerals. In the package according to FIG. 2, the cover 3 is an injection-molded cover 3. The volume of the cavity 4 surrounding the electronic device 2 may be left empty, or it may be filled with a solid material, in particular with a suitable blackout material, like a polymer, for instance.

An absorber film 13 comprising nanomaterial may be applied on the cover 3. A film thickness of 1 mm is maximally required if radiation having an energy of not more than 150 keV is to be shielded by a quantum dot absorber film with hexagonal closest packing. If a sufficiently thick absorber film 13 comprising nanomaterial is present, the cover 3 may be formed from any material that is conventionally used for an injection-molded cover. In this case, the absorber film 13 may especially comprise nanoparticles absorbing X-radiation, while the injection-molded cover 3 may absorb visible, ultraviolet or infrared light. If no absorber film 13 is applied, the injection-molded cover 3 is at least partially formed from nanomaterial.

Figure 3:
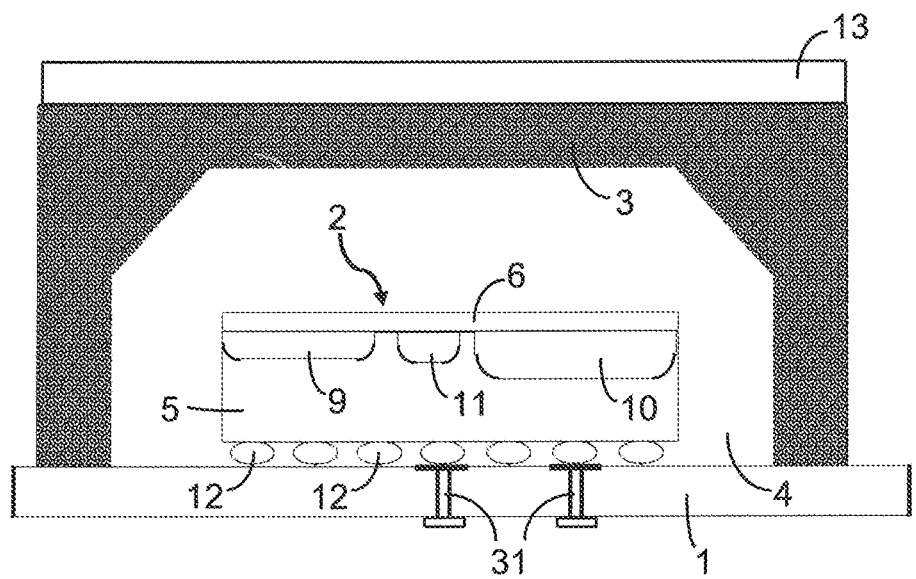
FIG. 3 is a cross section of a radiation-hardened package with an injection-molded cover and an absorber film comprising nanomaterial.

FIG. 3 is a cross section of a further radiation-hardened package with an injection-molded cover. Elements of the package according to FIG. 3 that correspond to elements of the package according to FIG. 2 are designated with the same reference numerals. In the package according to FIG. 3, electric connections between the integrated components of the electronic device 2 and the interconnections 31 in the carrier 1 are provided by solder balls 12 at the bottom of the substrate 5, which comprises through-substrate vias forming electric interconnections between the integrated components and the solder balls 12.

In the package according to FIG. 3, the injection-molded cover 3 may comprise nanomaterial. An absorber film 13 comprising nanomaterial may instead or additionally be applied as in the package according to FIG. 2.

Figure 4:
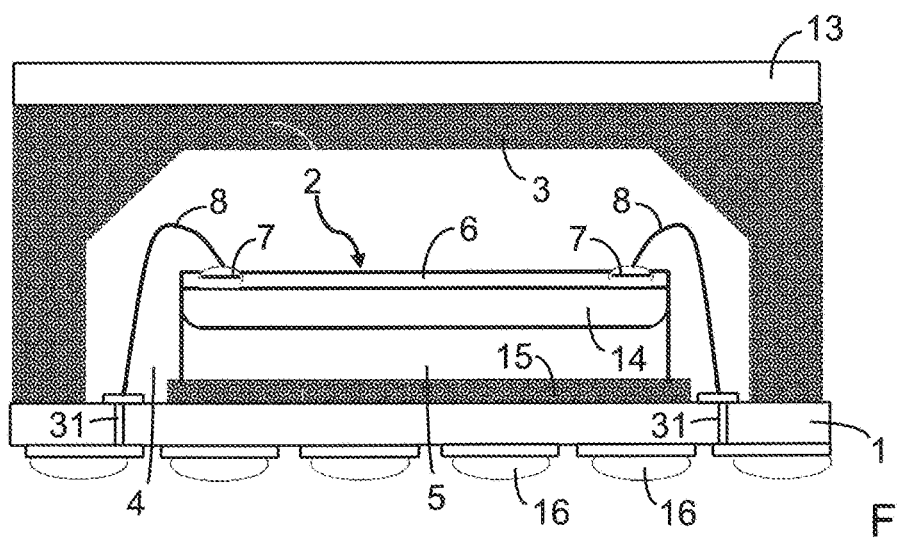
FIG. 4 is a cross section of a radiation-hardened package with an adhesive layer comprising nanomaterial.

FIG. 4 is a cross section of a radiation-hardened package with an adhesive layer comprising nanomaterial. Elements of the package according to FIG. 4 that correspond to elements of the package according to FIG. 2 are designated with the same reference numerals. In the package according to FIG. 4, the electronic device 2 and in particular the substrate 5 is mounted on the carrier 1 by means of an adhesive layer 15 comprising nanomaterial. The adhesive layer 15 may especially comprise an electrically conductive glue comprising nanoparticles.

In the package according to FIG. 4, the cover 3 may be an injection-molded cover, as shown in FIG. 4 by way of example, or a glob top as in the package according to FIG. 1. The cover 3 may also comprise nanomaterial, which may include the same kind of nanoparticles as the adhesive layer 15 or a different kind of nanoparticles. An absorber film 13 comprising nanomaterial may instead or additionally be applied as in the package according to FIG. 3.

In the package according to FIG. 4, pads 7 and wire bonds 8 may be provided for the electric connections between components of an integrated circuit 14 and the interconnections 31 in the carrier 1. Instead, solder balls 12 at the bottom of the substrate 5 may be used as in the package according to FIG. 3. The solder balls 12 can be arranged in openings of the adhesive layer 15. If the adhesive layer 15 is electrically conductive, it may be structured to form individual electric connections between the electronic device 2 and interconnections of the carrier 1. FIG. 4 shows further solder balls 16 at the bottom surface of the carrier 1 for external electric connection.

Figure 5:
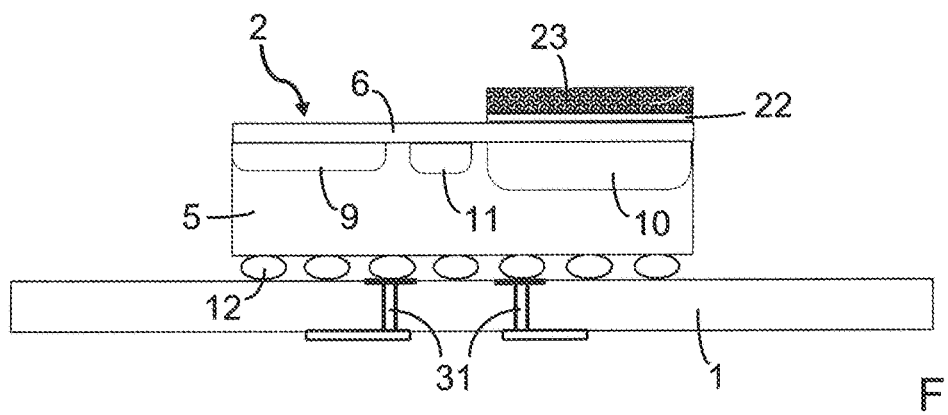
FIG. 5 is a cross section of a radiation-hardened package with an absorber film comprising nanomaterial applied to a semiconductor chip or die.

FIG. 5 is a cross section of a radiation-hardened package with an absorber film comprising nanomaterial applied to a semiconductor chip, wafer level chip scale package or die. Elements of the package according to FIG. 5 that correspond to elements of the package according to FIG. 3 are designated with the same reference numerals. The electronic device 2 is mounted on a carrier 1, which may be a printed circuit board (PCB), a laminate, a flex circuit, a substrate or an interposer, for instance. The electronic device 2 may comprise a substrate 5 of semiconductor material with a BEOL (back end of line) layer 6 including a wiring. Solder balls 12 providing electric connections can be arranged at the bottom of the substrate 5 and electrically connected to interconnections 31 in the carrier 1, for instance. The electronic device 2 may comprise various integrated components, like a photodetector 9, an integrated circuit 10 and a guard ring 11, as shown in FIG. 5 by way of example.

FIG. 5 shows a solution with bump bonds at the bottom, such as may be used in practice with wafer level packaging technology, in combination with through silicon vias (TSVs) and a backside redistribution layer to connect the bond pads to the wire bumps. Other packaging techniques could be used, such as wire bonding (similar to FIG. 7) or flip chip technology. The absorber film may be deposited on wafer during or at the end of the wafer processing, or during assembly of the chip in its package.

A shield 22, in particular a light shield, which may be formed from aluminum, copper, tungsten, or any combination thereof, is arranged on the electronic device 2. An absorber film 23 comprising nanomaterial is applied on or above the shield 22. The shield 22 and the absorber film 23 may especially be arranged on a partial area of the upper surface of the electronic device 2. FIG. 5 shows the shield 22 and the absorber film 23 arranged above the integrated circuit 10, by way of example. The shield 22 prevents light emitted by the nanomaterial of the absorber film 23 from influencing the integrated circuit 10.

Figure 6:
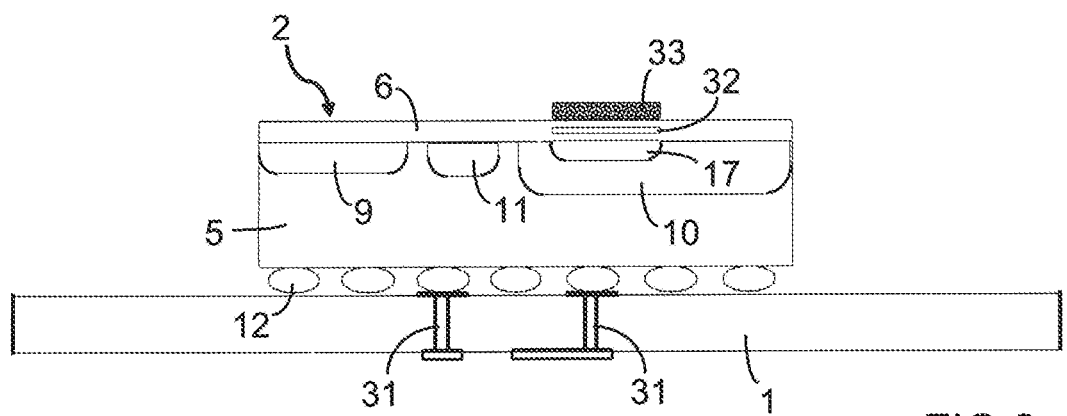
FIG. 6 is a cross section of a further radiation-hardened package with an absorber film comprising nanomaterial applied to a semiconductor chip or die.

FIG. 6 is a cross section of a further radiation-hardened package with an absorber film comprising nanomaterial.

Elements of the package according to FIG. 6 that correspond to elements of the package according to FIG. 5 are designated with the same reference numerals. In the package according to FIG. 6, a shield 32, in particular a light shield, which may be formed from aluminum, copper, tungsten, or any combination thereof, is arranged in the BEOL layer 6. The shield 32 may especially be formed by a metallization layer of a wiring. Thus the shield 32 is embedded in the BEOL layer 6. An absorber film 33 comprising nanomaterial is applied on the BEOL layer 6 above the shield 32. The shield 32 and the absorber film 33 may especially be arranged above a transistor 17, which forms a component of the integrated circuit 10, for example. The shield 32 prevents light emitted by the nanomaterial of the absorber film 33 from influencing the transistor 17 or other components of the integrated circuit 10.

Figure 7:
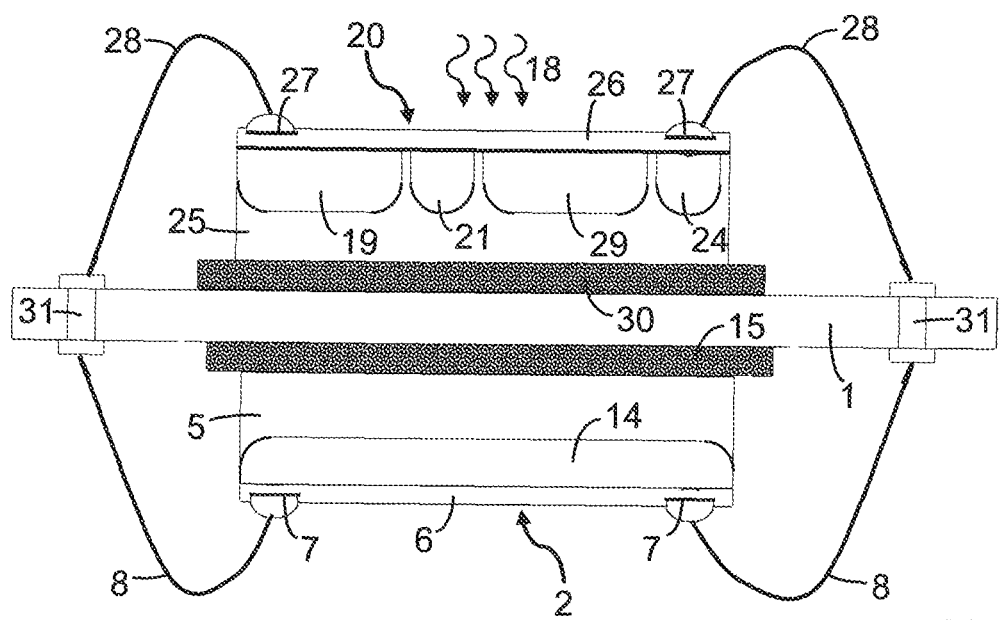
FIG. 7 is a cross section of an assembly of radiation-hardened packages with adhesive layers comprising nanomaterial.

FIG. 7 is a cross section of an assembly of radiation-hardened packages with adhesive layers 15, 30 comprising nanomaterial. The electronic device 2 and a further electronic device 20 are mounted on opposite surfaces of the carrier 1. Each of the electronic devices 2, 20 may particularly be any of the packages described above. In the example of FIG. 7, the electronic device 2 comprises an integrated circuit 14, and the further electronic device 20 comprises photodetectors 19, 29 and guard rings 21, 24. The electric connections include pads 7, 27 and wire bonds 8, 28 to the interconnections 31 in the carrier 1. In particular, terminals of the electronic device 2 and further terminals of the further electronic device 20 may thus be interconnected, as shown in FIG. 7. The electric connections may differ from the example shown in FIG. 7, according to the requirements of individual embodiments and applications. In the example shown in FIG. 7, the upper surface of the further electronic device 20 is provided for incidence of radiation 18.

In the assembly according to FIG. 7, the electronic devices 2, 20 are both mounted to the carrier 1 by means of adhesive layers 15, 30 comprising nanomaterial. The adhesive layers 15, 30 can comprise the same nanomaterial or different kinds of nanomaterial.

Figure 8:
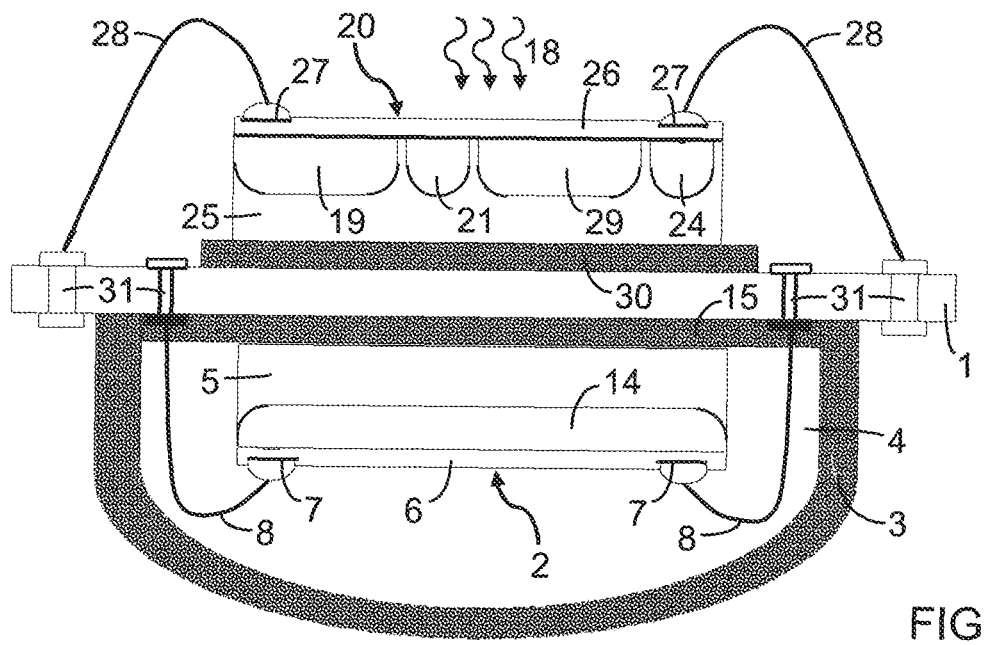
FIG. 8 is a cross section of an assembly of radiation-hardened packages with adhesive layers comprising nanomaterial and a glop top comprising a nanomaterial.

FIG. 8 is a cross section of an assembly of radiation-hardened packages with adhesive layers comprising nanomaterial and a glob top comprising nanomaterial. Elements of the package according to FIG. 8 that correspond to elements of the package according to FIG. 7 are designated with the same reference numerals. In the package according to FIG. 8, the electronic device 2 is covered by a glob top, and the cover 3 comprising nanomaterial is applied on the glob top. The cover 3 may instead be an injection-molded cover, and the cavity 4 formed by the cover 3 may be left empty, according to some of the packages described above.

The electronic device 2 is mounted to the carrier 1 by means of an adhesive layer 15, which may also comprise nanomaterial. The further electronic device 20 is mounted to the carrier 1 by means of a further adhesive layer 30, which may also comprise nanomaterial. The adhesive layers 15, 30 and the cover 3 can comprise the same nanomaterial or different kinds of nanomaterial. In the package according to FIG. 8, the substrate 25 of the further electronic device 20 does not extend laterally over the package formed by the electronic device 2 and its cover 3. Electric connections by pads 7, 27, wire bonds 8, 28 and interconnections 31 of the carrier 1 are only schematically indicated in FIG. 8 as examples and may be varied according to the requirements of individual embodiments and applications.

The described package improves the shielding of electronic devices from X-ray radiation at low cost. It can be produced by method steps known per se in semiconductor technology, in particular from the manufacture of consumer electronics.

The invention claimed is:

1. A package for an electronic device, comprising:
a carrier,
an electronic device arranged on the carrier,
a shield arranged on the electronic device on a side facing away from the carrier, and
an absorber film comprising nanomaterial applied on or above the shield,
wherein the nanomaterial comprised by the absorber film is tuned to absorb X-radiation, such that the package shields the electronic device against X-radiation.

2. The package of claim 1, wherein the shield and the absorber film are only arranged on a partial area of an upper surface of the electronic device facing away from the carrier.

3. The package of claim 2, further comprising:
an integrated circuit of the electronic device, the shield and the absorber film being only arranged above the integrated circuit.

4. The package of claim 3, further comprising:
a transistor forming a component of the integrated circuit, the shield and the absorber film being only arranged above the transistor.

5. The package of claim 1, wherein the shield is formed from aluminum, copper, tungsten or a combination thereof.

6. A package for an electronic device, comprising:
a carrier, and
an electronic device arranged on the carrier, the electronic device being provided with a cover comprising nanomaterial, with an absorber film comprising nanomaterial, or with an adhesive layer comprising nanomaterial, and
a further electronic device arranged on the carrier on a side opposite the electronic device, the further electronic device being provided with a cover comprising nanomaterial, with an absorber film comprising nanomaterial, or with an adhesive layer comprising nanomaterial.

7. The package of claim 6, wherein
at least one of the electronic device and the further electronic device is provided with a cover, and
the cover comprises nanomaterial or is provided with an absorber film comprising nanomaterial.

8. The package of claim 7, wherein the cover is a glob top or part of a glob top.

9. The package of claim 7, wherein the cover is injection-molded.

10. The package of claim 7, wherein the cover comprises plastic or ceramic.

11. The package of claim 6, wherein at least one of the electronic device and the further electronic device is provided with an adhesive layer between the carrier and the electronic device or between the carrier and the further electronic device, respectively, the adhesive layer comprising nanomaterial.

12. The package of claim 6, further comprising:
an integrated circuit in the electronic device, and
a photodiode in the further electronic device, the integrated circuit being configured as a read-out circuit for the photodiode.

13. The package of claim 6, further comprising:
an interconnection in the carrier, the interconnection electrically connecting the electronic device and the further electronic device.

14. The package of claim 1, wherein the nanomaterial comprises a material of the group consisting of PbS, PbSe, ZnS, ZnS, CdSe, CdTe, copper sulfide, copper oxide, organic perovskites and inorganic perovskites, or any combination thereof.

15. The package of claim 1, wherein the shield is a light shield is arranged between the electronic device and the absorber film.

16. The package of the claim 6, wherein the cover contains nanoparticles for X-ray absorption.

* * * * *